(12) United States Patent
Cao et al.

(10) Patent No.: US 9,097,951 B2
(45) Date of Patent: Aug. 4, 2015

(54) THIN FILM TRANSISTOR ARRAY SUBSTRATE AND METHOD FOR MANUFACTURING THE SAME, AND LIQUID CRYSTAL DISPLAY DEVICE

(71) Applicant: Shanghai AVIC Optoelectronics Co., Ltd., Shanghai (CN)

(72) Inventors: Zhaokeng Cao, Shanghai (CN); Yujie Zhao, Shanghai (CN)

(73) Assignee: Shanghai AVIC Optoelectronics Co., Ltd., Shanghai (CN)

( * ) Notice: Subject to any disclaimer, the term of this patent is extended or adjusted under 35 U.S.C. 154(b) by 124 days.

(21) Appl. No.: 13/890,159

(22) Filed: May 8, 2013

(65) Prior Publication Data

US 2014/0176843 A1 Jun. 26, 2014

(30) Foreign Application Priority Data

Dec. 24, 2012 (CN) .......................... 2012 1 0568430

(51) Int. Cl.
*G02F 1/1333* (2006.01)
*G02F 1/1343* (2006.01)
*G02F 1/1362* (2006.01)
*H01L 29/66* (2006.01)
*H01L 29/786* (2006.01)

(52) U.S. Cl.
CPC .... *G02F 1/136286* (2013.01); *G02F 1/134363* (2013.01); *H01L 29/66742* (2013.01); *H01L 29/786* (2013.01); *G02F 2001/134318* (2013.01)

(58) Field of Classification Search
CPC .......... G02F 1/13333; G02F 1/133305; G02F 1/133351; G02F 1/134336; G02F 1/134363; G02F 1/133707; G02F 1/136213; G02F 1/1393

USPC .................. 349/158, 141, 143, 146
See application file for complete search history.

(56) References Cited

U.S. PATENT DOCUMENTS 8,194,218 B2 6/2012 Kang et al.
2008/0186440 A1* 8/2008 Lim et al. ...................... 349/141
2008/0303024 A1* 12/2008 Song et al. ...................... 257/59

(Continued)

FOREIGN PATENT DOCUMENTS

| CN | 102169259 A | 8/2011 |
| EP | 2434338 A2 | 3/2012 |
| EP | 2434338 A3 | 6/2012 |

OTHER PUBLICATIONS

European Search Report for EP Patent Application No. 13164452.8, mailed on Jun. 17, 2013, 7 pages.

*Primary Examiner* — Mike Qi
(74) *Attorney, Agent, or Firm* — Kilpatrick Townsend & Stockton LLP

(57) ABSTRACT

A thin film transistor array substrate, a method for manufacturing the same, and a liquid crystal display device having the thin-film transistor array substrate are disclosed. The thin film transistor array substrate includes a data line formed on a transparent substrate, a first transparent electrode located in a same layer as the data line, an insulating layer covering the data line and the first transparent electrode, and a second transparent electrode located on the insulating layer. The second transparent electrode includes a first transparent sub-electrode and a second transparent sub-electrode, and the width of the first transparent sub-electrode is less than the width of the first transparent electrode, and the width of the second transparent sub-electrode is greater than the width of the data line.

15 Claims, 8 Drawing Sheets

(56) References Cited

U.S. PATENT DOCUMENTS

2009/0081820 A1* 3/2009 Park et al. .................. 438/34
2010/0245220 A1 9/2010 Hsu et al.
2011/0317117 A1* 12/2011 Kim et al. .................. 349/138

* cited by examiner (a)

(b)

THIN FILM TRANSISTOR ARRAY SUBSTRATE AND METHOD FOR MANUFACTURING THE SAME, AND LIQUID CRYSTAL DISPLAY DEVICE

This application claims priority to Chinese Patent Application No. 201210568430.4, entitled "Thin Film Transistor Array Substrate and Method for Manufacturing the Same, and Liquid Crystal Display Device" and filed with the Chinese Patent Office on Dec. 24, 2012, which is hereby incorporated by reference in its entirety.

FIELD OF THE INVENTION

The present invention relates to liquid crystal display, and in particular to a thin film transistor array substrate and a method for manufacturing the same, and a liquid crystal display device including the thin-film transistor array substrate.

BACKGROUND OF THE INVENTION

A thin film transistor liquid crystal display (TFT-LCD) is a type of liquid crystal display, and is an active matrix type LCD. The thin film transistor liquid crystal display has features such as low radiation, low thickness and low power consumption, and is widely applied in various fields.

For the liquid crystal display, there is a problem that image contrast reduces while a viewing angle increases. Therefore there is a viewing angle problem in the liquid crystal display. In order to achieve a wide viewing angle display, both an in-plane switch (IPS) type liquid crystal display panel and a fringe field switching (FFS) type liquid crystal display panel have been developed. In the field of liquid crystal displays, FFS is a wide viewing angle technology developed to be applied in a large size panel and high definition desktop display and liquid crystal television. In the FFS technology, a transparent ITO electrode is used instead of an opaque metal electrode in the IPS. The width of the electrode and the distance between the electrodes are reduced. The liquid crystal molecules both between the electrodes and directly above the electrodes may oriented to rotate in the plane direction (parallel to a substrate) in response to the fringe electric field generated by electrodes between pixels in a same plane. Therefore light transmittance of a liquid crystal layer is increased. The FFS technology solves a problem of low light transmittance of the conventional IPS technology, so as to achieve high light transmittance with a wide viewing angle.

Referring to FIG. 1, FIG. 1 is a structural schematic diagram of electrodes in the existing IPS type liquid crystal display panel. In the IPS liquid crystal display panel, a horizontal electric field driving the liquid crystal is formed between a pixel electrode 1 and a common electrode 2. The driving voltage is increased according to the distance between the pixel electrode 1 and the common electrode 2. Sometimes the required driving voltage may be greater than a voltage that can be supplied by a driving chip. In such cases, the strength of the horizontal electric field formed by the driving chip is too weak to effectively drive the liquid crystals, leading to poor display quality.

Referring to FIG. 2, FIG. 2 is a structural schematic diagram of electrodes in a FFS liquid crystal display panel. In the FFS liquid crystal display panel, a pixel electrode 3 is located in an aperture region of a pixel unit in an entire plane structure, and forms a fringe electric field with a common electrode 4 above the pixel electrode 3. Although the pixel electrode 3 is transparent, the pixel electrode still absorbs 5% of transmitting light, leading to reduction in the light transmittance of the panel.

SUMMARY OF THE INVENTION

One implementation is a thin film transistor array substrate, including a transparent substrate, a data line formed on the transparent substrate, and a first transparent electrode located in a same layer as the data line. The thin film transistor array substrate also includes an insulating layer covering the data line and the first transparent electrode, and a second transparent electrode located on the insulating layer. The second transparent electrode includes a first transparent sub-electrode and a second transparent sub-electrode, where the first transparent sub-electrode is located above the first transparent electrode, and the width of the first transparent sub-electrode is less than the width of the first transparent electrode. The second transparent sub-electrode is located above the data line, and the width of the second transparent sub-electrode is greater than the width of the data line.

Another implementation is a liquid crystal display device, including a thin film transistor array substrate, a color filter substrate disposed on the array substrate, and a liquid crystal layer between the thin film transistor array substrate and the color filter substrate. The thin film transistor array substrate includes a transparent substrate, a data line formed on the transparent substrate, and a first transparent electrode located in a same layer as the data line. The thin film transistor array substrate also includes an insulating layer covering the data line and the first transparent electrode, and a second transparent electrode located on the insulating layer. The second transparent electrode includes a first transparent sub-electrode and a second transparent sub-electrode, and the first transparent sub-electrode is located above the first transparent electrode. The width of the first transparent sub-electrode is less than the width of the first transparent electrode, the second transparent sub-electrode is located above the data line, and the width of the second transparent sub-electrode is greater than the width of the data line.

Another implementation is a method of manufacturing a thin film transistor array substrate. The method includes providing a transparent substrate, forming a first transparent electrode and a data line on the transparent substrate, and forming an insulating layer covering the first transparent electrode and the data line. The method also includes forming a second transparent electrode on the insulating layer, where the second transparent electrode includes a first transparent sub-electrode and a second transparent sub-electrode, and where the first transparent sub-electrode is located above the first transparent electrode. The width of the first transparent sub-electrode is less than the width of the first transparent electrode, the second transparent sub-electrode is located above the data line, and the width of the second transparent sub-electrode is greater than the width of the data line.

DETAILED DESCRIPTION OF THE INVENTION

Figure 1:
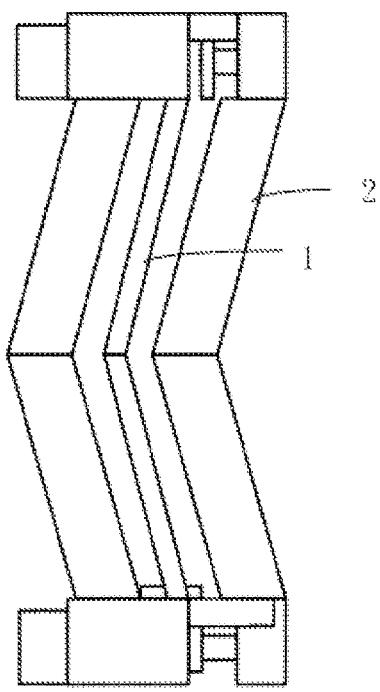
FIG. 1 is a schematic diagram of a pixel electrode of an existing IPS liquid crystal display panel.
Figure 2:
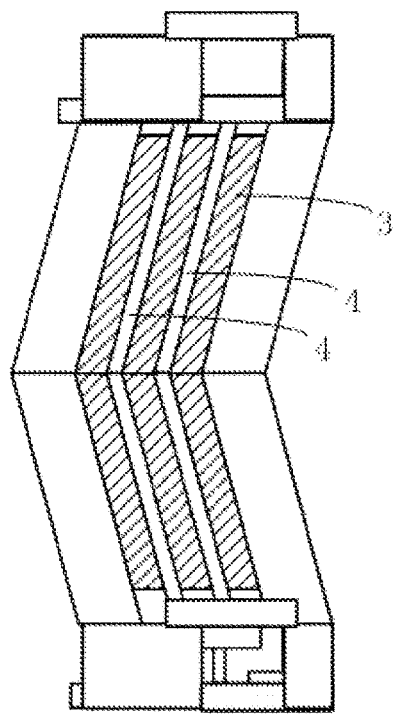
FIG. 2 is a schematic diagram of a pixel electrode of an existing FFS liquid crystal display panel.
Figure 3:
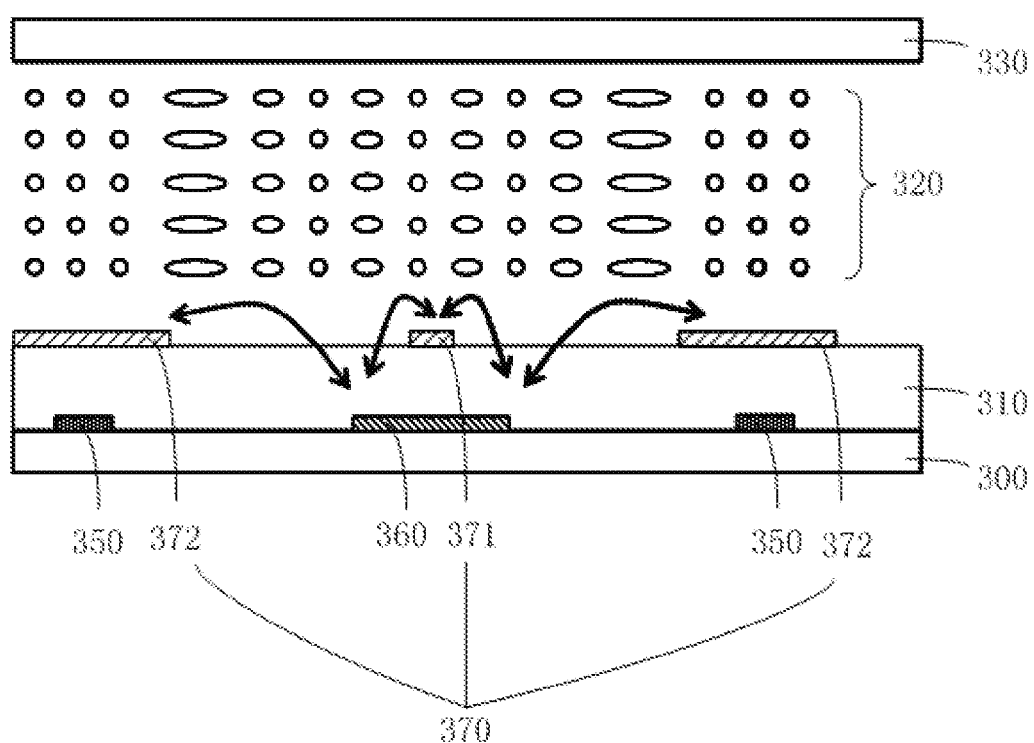
FIG. 3 is a schematic diagram of a liquid crystal display device according to a first embodiment.

According to certain embodiments, a liquid crystal display device and a thin film transistor array substrate included in the liquid crystal display device, are arranged as shown in FIG. 3. The liquid crystal display device includes the thin film transistor array substrate and a color filter substrate 330 which is disposed opposite the array substrate. A liquid crystal layer 320 fills the gap between the thin film transistor array substrate and the color filter substrate 330. The drawings of embodiments do not generally show the correct proportion and size of features and are only schematic diagrams for illustrating technical characteristics. For example, the detailed structure of the color filter substrate 330 is omitted in the accompanying drawings.

Referring to FIG. 3, the thin film transistor array substrate includes a transparent substrate 300. A data line 350 and a first transparent electrode 360 are formed on the transparent substrate 300. In some embodiments, the first transparent electrode 360 is a pixel electrode. The thin film transistor array substrate further includes an insulating layer 310 which may be made of a transparent insulating material. The insulating layer 310 covers the data line 350 and the first transparent electrode 360. A second transparent electrode 370 is disposed on the insulating layer 310. In some embodiments, the second transparent electrode 370 is a common electrode and includes a first transparent sub-electrode 371 and a second transparent sub-electrode 372.

In the illustrated embodiment, the first transparent sub-electrode 371 of the second transparent electrode 370 is located above the first transparent electrode 360. In addition, the first transparent sub-electrode 371 is disposed such that the center thereof is aligned with the center of the first transparent electrode 360 in the normal direction of the transparent substrate 300. It may be understood that the first transparent sub-electrode 371 and the first transparent electrode 360 are symmetrical at left and right with respect to a vertical line intersecting the centers of the first transparent electrode 360 and the first transparent sub electrode 371. Furthermore, the width of the first transparent sub-electrode 371 is less than the width of the first transparent electrode 360. In addition, the second transparent sub-electrode 372 of the second transparent electrode 370 is located above the data line 350, and the width of the second transparent sub-electrodes 372 is greater than the width of the data line 350.

In a case of the above described configuration, when the thin film transistor array substrate is in operation, if a certain voltage is applied between the first transparent electrode 360 and the second transparent electrode 370, for example, if voltages of opposite polarities are respectively applied to the two electrodes, a horizontal electric field is formed between the first transparent electrode 360 and the second transparent electrode 370.

Specifically, as shown by curves with two-way arrows in FIG. 3, a stronger horizontal electric field is formed between the first transparent sub-electrode 371 and the first transparent electrode 360. This is because the first transparent sub-electrode 371 is disposed such that the center thereof is aligned with the center of the first transparent electrode 360 in the direction normal to the transparent substrate 300, and the width of the first transparent sub-electrode 371 is less than the width of the first transparent electrode 360. As a result, intensive electric field lines facing the liquid crystal layer 320 which is over the first transparent sub-electrode 371 is generated by means of the first transparent sub-electrode 371 and the first transparent electrode 360 which is under the first transparent sub-electrode 371. That is to say, a stronger horizontal electric field is formed between the first transparent sub-electrode 371 and the first transparent electrode 360. Moreover, since the width of the first transparent sub-electrode 371 is less than the width of the first transparent electrode 360, the first transparent sub-electrode 371 does not completely shield the first transparent electrode 360.

Another horizontal electric field facing the liquid crystal layer 320 is also formed between the second transparent sub-electrode 372 and the first transparent electrode 360. Since the second transparent sub-electrode 372 is located above the data line 350, and the width of the second transparent sub-electrode 372 is greater than the width of the data line 350, the data lines 350 may be shielded by the second transparent sub-electrode 372. thus, the horizontal electric field formed between the first transparent electrode 360 and the second transparent electrode 370 may not be interfered. Therefore, the horizontal electric field is stable and has high intensity and results in better driving of the liquid crystal molecules in the liquid crystal layer 320.

It should be noted that, although not shown in FIG. 3, thin film transistors are formed on the transparent substrate 300 of the thin film transistor array substrate. The first transparent electrode 360 may be electrically connected to a drain electrode of the thin film transistor, and the data line 350 may be electrically connected to a source electrode of the thin film transistor. The thin film transistor array substrate further includes a scanning line (not shown in FIG. 3), and a gate electrode of the thin film transistor is electrically connected to the scanning line.

The thin film transistor array substrate has advantages for both IPS array substrates and FFS array substrates. That is, by using the horizontal electric field to cause the liquid crystal to rotate, a liquid crystal display with a large viewing angle and no color difference when being viewed from various viewing angles is achieved. In addition, the image response of the liquid crystal display is quick and sensitive. According to the thin film transistor array substrate of the present embodiment, a problem for IPS array substrates that a weak electric field easily occurs is avoided, a problem of low light transmittance for FFS array substrates is also avoided. Accordingly, the thin film transistor array substrate may be regarded as a hybrid enhanced array substrate.

Figure 4:
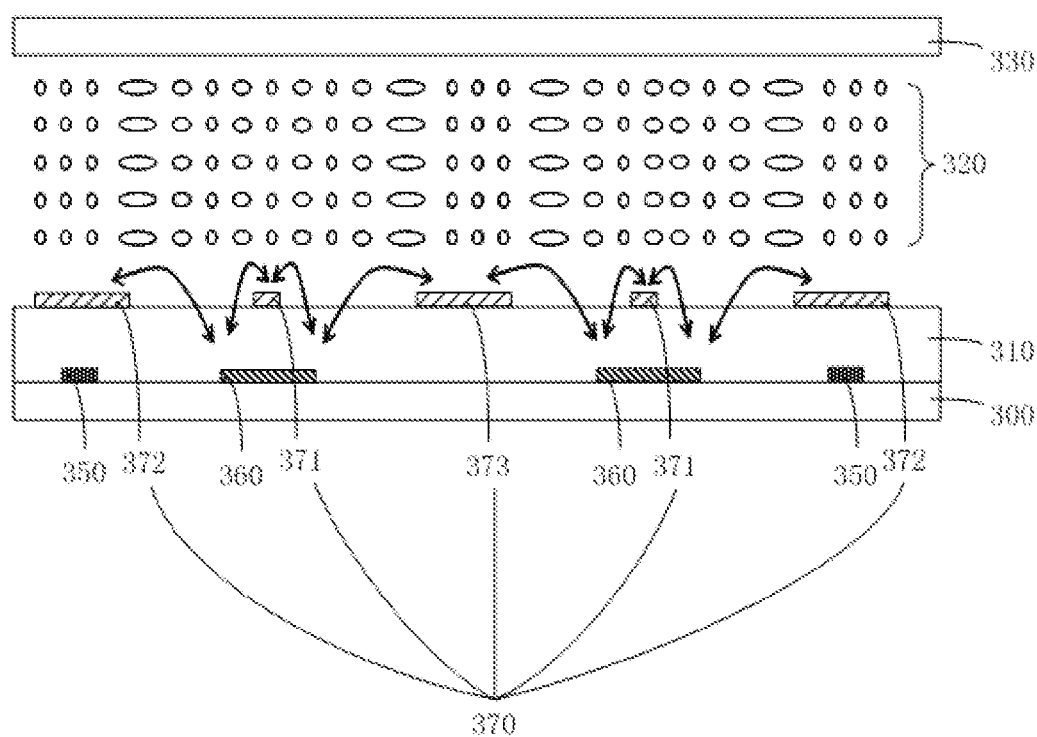
FIG. 4 is a schematic diagram of a liquid crystal display device according to a second embodiment.

FIG. 4 is a schematic diagram of a liquid crystal display device according to a second embodiment. The liquid crystal display device of FIG. 4 includes structures which are similar to the structures described above with reference to FIG. 3.

Referring to FIG. 4, the second transparent electrode 370 of the thin film transistor array substrate further includes a third transparent sub-electrode 373, which is located between the two adjacent first transparent sub-electrodes 371. Since the third transparent sub-electrode 373 is disposed between the two adjacent first transparent sub-electrodes 371, the third transparent sub-electrode 373 forms horizontal electric fields with the first transparent electrodes 360. Therefore, the horizontal electric field lines are more intensive, the horizontal electric field formed from the thin film transistor array substrate is stronger, and the display performance of the liquid crystal display according to the present embodiment is further improved.

Figure 5:
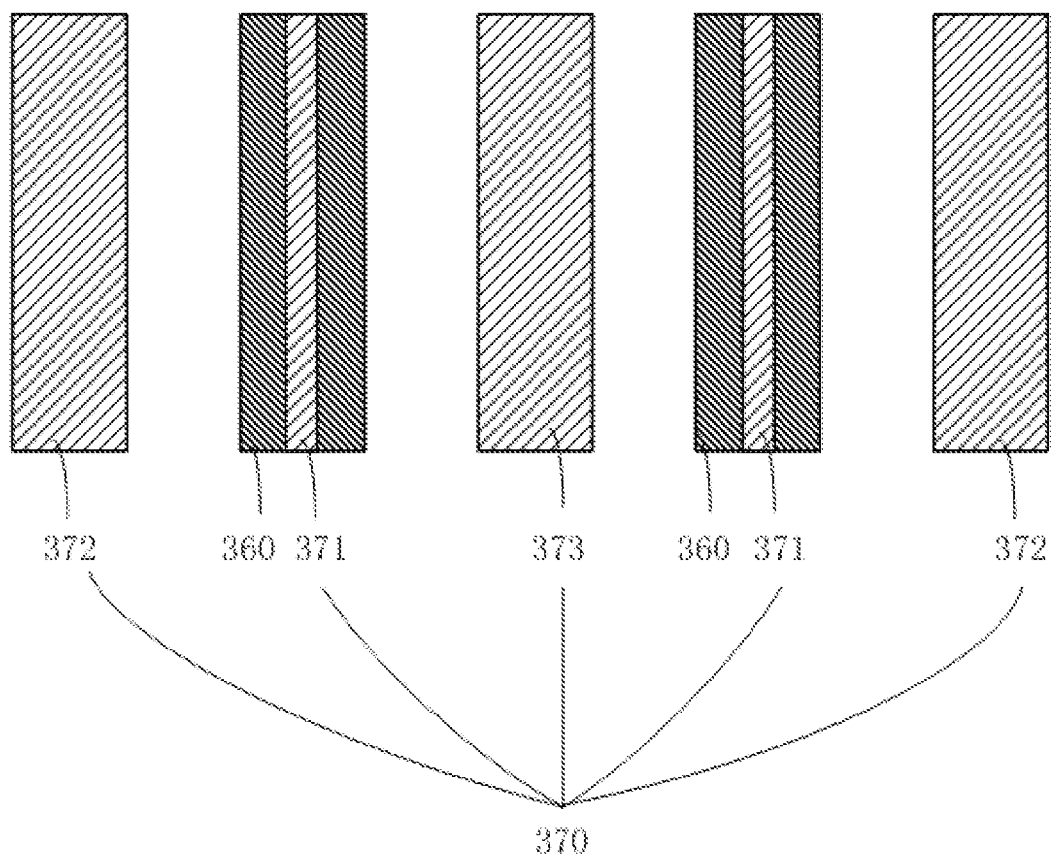
FIG. 5 is a schematic top view of a thin film transistor array substrate of the liquid crystal display device according to the second embodiment.

FIG. 5 is a schematic top view of the thin film transistor array substrate in the liquid crystal display device according to the second embodiment. In FIG. 5, structures of the transparent substrate 300, the insulating layer 310 and other layers of the thin film transistor array substrate are omitted, and only the first transparent electrodes 360 and the second transparent electrode 370 are shown. Accordingly, the positional relationship between the first transparent electrodes 360 and the second transparent electrode 370 is shown clearly. As shown, the center of the first transparent sub-electrode 371 of the second transparent electrode 370 is aligned with the center of the first transparent electrode 360 in the normal direction to the transparent substrate 300, and the width of the first transparent sub-electrode 371 is less than the width of the first transparent electrode 360. The width of the second transparent sub-electrode 372 of the second transparent electrode 370 is greater than the width of the data line 350. Accordingly, the data line 350 is covered by the second transparent sub-electrode 372 and is not shown in the figure. A third transparent sub-electrode 373 is further formed between the two first transparent sub-electrodes 371. It should be noted that, in other embodiments, the width of the third transparent sub-electrode 373 may be different, and in other cases, more than one third transparent sub-electrode 373 may be disposed between the two first transparent sub-electrodes 371.

FIGS. 6-9 are schematic diagrams illustrating results of various steps of a method of manufacturing a thin film transistor array substrate.

In Step S1, a transparent substrate is provided.

Figure 6:
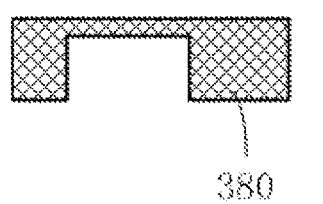
FIGS. 6-9 are schematic diagrams of various steps illustrating a method of manufacturing a thin film transistor array substrate according to a third embodiment.
Figure 6:
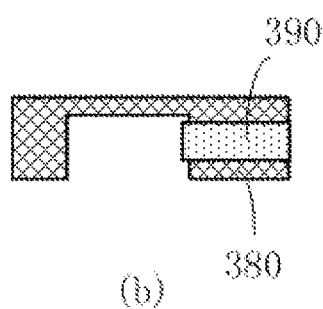

After the transparent substrate is provided, a gate electrode of a thin film transistor and a scanning line 380 may be formed on the transparent substrate (not shown in the figure). The gate electrode is connected to the scanning line 380. The gate electrode and the scanning line may be formed integrally with a same material in a same step. For example, for the scanning line 380 shown in FIG. 6 (a), a downwardly protruding portion of the scanning line 380 is the gate electrode. A gate insulating layer (not shown in the figure) is formed to cover the gate electrode and the scanning line 380. Then, as shown in FIG. 6 (b), a semiconductor layer 390 (also known as an active layer) is formed on the gate insulating layer. The semiconductor layer 390 and the gate electrode are insulated from each other by the gate insulating layer. In some embodiments, an ohmic contact layer (not shown in the figure) may be further formed on the semiconductor layer 390 so as to reduce contact resistance between a subsequently formed source electrode of the thin film transistor and the semiconductor layer 390, and between a subsequently formed drain electrode of the thin film transistor and the semiconductor layer 390.

In Step S2, a first transparent electrode and data line are formed on the transparent substrate.

Figure 7:
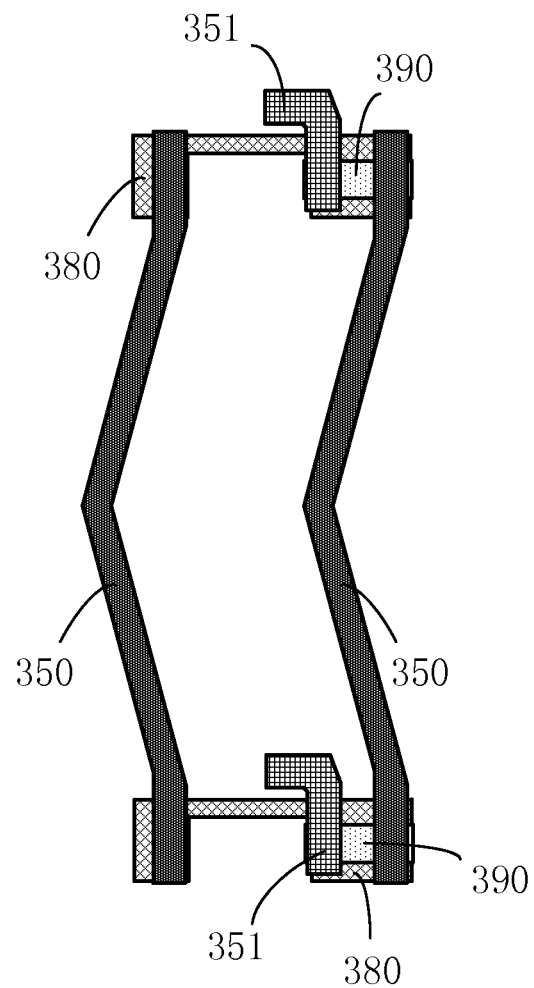

As shown in FIG. 7, the data line 350, which is connected to the source electrode of the thin film transistor, and the drain electrode 351 of the thin film transistor are simultaneously formed. The data line 350, the source electrode, and the drain electrode 351 may be formed simultaneously with a same material in a same process step. For example, the data line 350, the source electrode, and the drain electrode 351 may be simultaneously formed with a same depositing metal layer through a same exposure and development process. The data line 350 is electrically connected to the source electrode of the thin film transistor and may be formed integrally with the source electrode of the thin film transistor. The source electrode and the drain electrode 351 contact the semiconductor layer 390. In some embodiments, the source electrode and the drain electrode 351 contact the semiconductor layer 390 via the ohmic contact layer.

Figure 8:
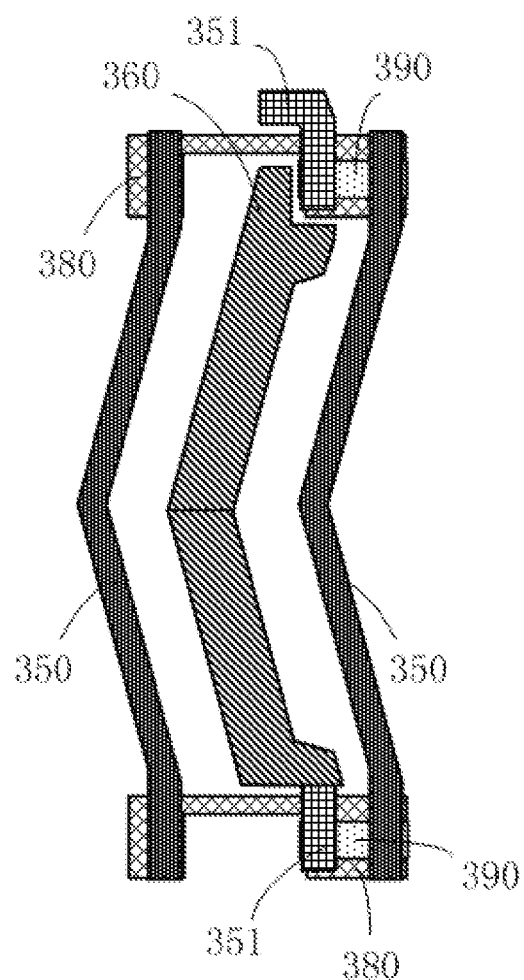

A first transparent electrode 360 may be formed on the transparent substrate by a lithography process, as shown in FIG. 8. The first transparent electrode 360 may be a pixel electrode, and the first transparent electrode 360 is electrically connected to the drain electrode 351.

In Step S3, an insulating layer is formed to cover the first transparent electrode 360 and the data line 350.

After the first transparent electrode 360 is formed, an insulating layer (not shown in FIG. 8), such as an insulating layer 310 in FIG. 3 or FIG. 4 is formed on the transparent substrate. The insulating layer covers the first transparent electrode 360, the data lines 350, and other structures formed on the transparent substrate. Various depositing processes such as a physical vapor deposition (PVD) process, a chemical vapor deposition (CVD) process or an atomic layer deposition (ALD) process may be used to form the insulating layer. Various other deposition processes may be performed.

In Step S4, a second transparent electrode is formed on the insulating layer.

Figure 9:
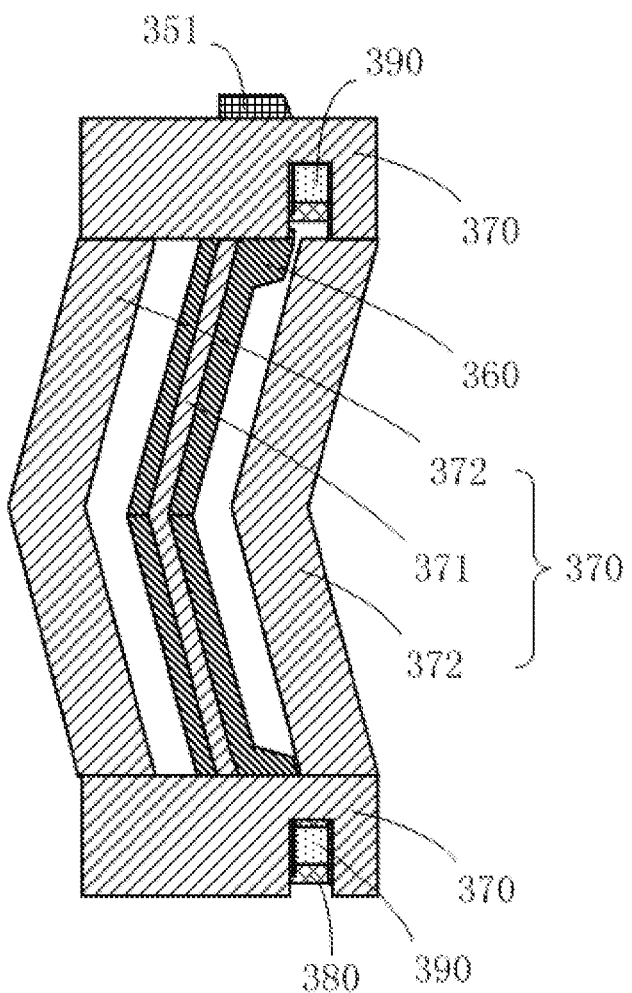

As shown in FIG. 9, a second transparent electrode 370 is formed on the insulating layer. The second transparent electrode 370 is a common electrode. It can be seen from FIG. 9 that the second transparent electrode 370 includes a first transparent sub-electrode 371 and a second transparent sub-electrode 372. The first transparent sub-electrode 371 is farther from the substrate than the first transparent electrode 360, and the width of the first transparent sub-electrode 371 is less than the width of the first transparent electrode 360. The second transparent sub-electrode 372 is located farther from the substrate than the data line, and the width of the second transparent sub-electrode 372 is greater than the width of the data line. During the fabrication process, the first transparent sub-electrode 371 is formed so that the center thereof is aligned with the center of the first transparent electrode 360 in a direction normal the transparent substrate. Because of the design of the mask used for forming the first transparent electrode 360 and the first transparent sub-electrode 371, the centers of the first transparent sub-electrode 371 and the first transparent electrode 360 are aligned in the direction normal to the transparent substrate.

In some embodiments, the second transparent electrode 370 formed in Step S4 includes at least two first transparent sub-electrodes 371. The second transparent electrode 370 may further include at least one third transparent sub-electrode. The third transparent sub-electrode may be located between the two adjacent first transparent sub-electrodes 371. The third transparent sub-electrode is electrically connected to at least one of the first transparent sub-electrode 371 and the second transparent sub-electrode 372.

Through Steps S1 to S4, the thin film transistor array substrate is manufactured, as shown in FIG. 9. Using the method or a method having similar or identical steps may be used to generate the thin-film transistor array substrate discussed above with reference to FIGS. 3-5.

It should be noted that, the method is described with reference to an embodiment generating a bottom gate type thin film transistor. As understood, however, by those skilled in the art, the method may also be used to manufacture a top gate type thin film transistor. For example, specifically, in Step S1, a semiconductor layer may be first formed on the provided substrate. In some embodiments, a buffer layer is formed before the semiconductor layer is formed, then a first insulating layer is formed on the semiconductor layer to cover the semiconductor layer, and then a gate electrode of a thin film transistor is formed on the first insulating layer and a second insulating layer which covers the gate electrode is formed on the gate electrode. The source electrode and the drain electrode of the thin film transistor formed subsequently in Step S2 are electrically connected to the semiconductor layer through via holes formed on the first insulating layer and the second insulating layer.

The difference between the method used for manufacturing the top gate type thin film transistor and the method used for manufacturing the bottom gate type thin film transistor in the present embodiment is only in the sequence of forming the gate electrode of the thin film transistor and the semiconductor layer in Step S1. In some embodiments, no change occurs in the subsequent steps.

The embodiments discussed herein are presented in a progressive manner, with the description for each next embodiment emphasizing the difference between it and the previously described embodiments. Hence, for examples of the same or similar parts between the embodiments, one can refer to the other embodiments.

The embodiments described above are only specific embodiments of the present invention, so that those skilled in the art may better understand the spirit of the present invention. However, the scope of protection of the present invention is not limited by the detailed descriptions of the specific embodiments. Modifications can be made to the specific embodiments of the present invention by those skilled in the art in light of the spirit of the present invention, without deviating from the protected scope of the present invention.

What is claimed is:

1. A thin film transistor array substrate, comprising:
a transparent substrate;
a plurality of data lines formed on the transparent substrate;
a plurality of first transparent electrodes located in a same layer as the data lines;
an insulating layer covering the data lines and the first transparent electrodes; and
a second transparent electrode located on the insulating layer, wherein the second transparent electrode comprises a plurality of sub-electrodes, wherein the plurality of sub-electrodes comprises all conductors which are electrically connected to one another and are spaced apart from one another by a plurality of slits, wherein the plurality of sub-electrodes comprises a plurality of first transparent sub-electrodes and a plurality of second transparent sub-electrodes, wherein the plurality of first transparent sub-electrodes comprises all sub-electrodes which are respectively located directly above the first transparent electrodes, and the width of one first transparent sub-electrode is less than the width of the first transparent electrode located directly below the one first transparent sub-electrode, wherein the plurality of second transparent sub-electrodes comprises all sub-electrodes which are respectively located directly above the data lines, and the width of one second transparent sub-electrode is greater than the width of the data line located directly below the one second transparent sub-electrode, and wherein each of the slits partially but not entirely overlaps one of the first transparent electrodes.

2. The thin film transistor array substrate according to claim 1, wherein between two adjacent data lines, the second transparent electrode comprises at least two first transparent sub-electrodes, and the second transparent electrode further comprises at least one third transparent sub-electrode, and wherein the third transparent sub-electrode is located between the two adjacent first transparent sub-electrodes.

3. The thin film transistor array substrate according to claim 1, wherein a center of one first transparent sub-electrode lines with a center of the first transparent electrode located directly below the one first transparent sub-electrode, in the direction normal to the transparent substrate.

4. The thin film transistor array substrate according to claim 1, wherein the first transparent electrodes are pixel electrodes, and the second transparent electrode is a common electrode.

5. The thin film transistor array substrate according to claim 1, wherein the first transparent electrodes are electrically connected to a plurality of drain electrodes of a plurality of thin film transistors, the data lines are electrically connected to a plurality of source electrodes of the thin film transistors, and a plurality of gate electrodes of the thin film transistors are electrically connected to scanning lines.

6. The thin film transistor array substrate according to claim 1, wherein one first transparent sub-electrode is located between two adjacent second transparent sub-electrodes, the first transparent sub-electrode corresponds to one first transparent electrode, and a slit between the first transparent sub-electrode and each of the two adjacent second transparent sub-electrodes partially but not entirely overlaps one of the first transparent electrodes.

7. The thin film transistor array substrate according to claim 1, wherein at least two first transparent sub-electrodes are located between two adjacent second transparent sub-electrodes, each of the first transparent sub-electrodes corresponds to one first transparent electrode, a slit between adjacent first transparent sub-electrodes partially but not entirely overlaps the first transparent electrodes corresponding to the adjacent first transparent sub-electrodes, and a slit between adjacent first transparent sub-electrode and second transparent sub-electrode partially but not entirely overlaps one of the first transparent electrodes.

8. A liquid crystal display device, comprising:
a thin film transistor array substrate;
a color filter substrate disposed on the array substrate; and
a liquid crystal layer between the thin film transistor array substrate and the color filter substrate,
wherein the thin film transistor array substrate comprises:
a transparent substrate;
a plurality of data lines formed on the transparent substrate;
a plurality of first transparent electrodes located in a same layer as the data lines;
an insulating layer covering the data lines and the first transparent electrodes; and
a second transparent electrode located on the insulating layer, wherein the second transparent electrode comprises a plurality of sub-electrodes, wherein the plurality of sub-electrodes comprises all conductors which are electrically connected to one another and are spaced apart from one another by a plurality of slits, wherein the plurality of sub-electrodes comprises a plurality of first transparent sub-electrodes and a plurality of second transparent sub-electrodes, wherein the plurality of first transparent sub-electrodes comprises all sub-electrodes which are respectively located directly above the first transparent electrodes, and the width of one first transparent sub-electrode is less than the width of the first transparent electrode located directly below the one first transparent sub-electrode, wherein the plurality of second transparent sub-electrodes comprises all sub-electrodes which are respectively located directly above the data lines, and the width of one second transparent sub-electrode is greater than the width of the data line located directly below the one second transparent sub-electrode, and wherein each of slits partially but not entirely overlaps one of the first transparent electrodes.

9. A method of manufacturing a thin film transistor array substrate, comprising:
providing a transparent substrate;
forming a plurality of first transparent electrodes and a plurality of data lines on the transparent substrate;
forming an insulating layer covering the first transparent electrodes and the data lines; and
forming a second transparent electrode on the insulating layer, wherein the second transparent electrode comprises a plurality of sub-electrodes, wherein the plurality of sub-electrodes comprises all conductors which are electrically connected to one another and are spaced apart from one another by a plurality of slits, wherein the plurality of sub-electrodes comprises a plurality of first transparent sub-electrodes and a plurality of second transparent sub-electrodes, wherein the plurality of first transparent sub-electrodes comprises all sub-electrodes which are respectively is located directly above the first transparent electrodes, and the width of one first transparent sub-electrode is less than the width of the first transparent electrode located directly below the one first transparent sub-electrode, wherein the plurality of second transparent sub-electrodes comprises all sub-electrodes which are respectively located directly above the data lines, and the width of one second transparent sub-electrode is greater than the width of the data line located directly below the one second transparent sub-electrode, and each of slits partially but not entirely overlaps one of the first transparent electrodes.

10. The method of manufacturing the thin film transistor array substrate according to claim 9, wherein between two adjacent data lines, the second transparent electrode comprises at least two first transparent sub-electrodes, and the second transparent electrode further comprises at least one third transparent sub-electrode, and wherein the third transparent sub-electrode is located between the two adjacent first transparent sub-electrodes.

11. The method of manufacturing the thin film transistor array substrate according to claim 9, wherein a center of one first transparent sub-electrode lines with a center of the first transparent electrode located directly below the one first transparent sub-electrode, in the direction normal to the transparent substrate.

12. The method of manufacturing the thin film transistor array substrate according to claim 9, wherein the first transparent electrodes are pixel electrodes, and the second transparent electrode is a common electrode.

13. The method of manufacturing the thin film transistor array substrate according to claim 9, wherein before forming the first transparent electrode and the data line on the transparent substrate, following steps are performed:
forming a gate electrode of a thin film transistor and a scanning line on the transparent substrate;
forming a gate insulating layer covering the gate electrode and the scanning line; and
forming a semiconductor layer on the gate insulating layer.

14. The method of manufacturing the thin film transistor array substrate according to claim 13, wherein a plurality of source electrodes and a plurality of drain electrodes of the thin film transistors are formed while the data lines are formed, the source electrodes and the drain electrodes contact the semiconductor layer, the first transparent electrodes are electrically connected to the drain electrodes of the thin film transistors, and the data lines are electrically connected to the source electrodes of the thin film transistors.

15. The method of manufacturing the thin film transistor array substrate according to claim 13, further comprising forming an ohmic contact layer on the semiconductor layer.

* * * * *